(12) United States Patent
Mautz

(10) Patent No.: US 6,420,098 B1
(45) Date of Patent: Jul. 16, 2002

(54) METHOD AND SYSTEM FOR MANUFACTURING SEMICONDUCTOR DEVICES ON A WAFER

(75) Inventor: Karl Mautz, Dresden (DE)

(73) Assignee: Motorola, Inc., Schaumburg, IL (US)

(*) Notice: Subject to any disclaimer, the term of this patent is extended or adjusted under 35 U.S.C. 154(b) by 84 days.

(21) Appl. No.: 09/614,199

(22) Filed: Jul. 12, 2000

(51) Int. Cl.⁷ .................. G03F 7/00; B65G 49/07
(52) U.S. Cl. .................. 430/313; 430/311; 430/314; 430/322; 430/325; 430/330; 355/27; 396/611; 414/935
(58) Field of Search .................. 430/311, 313, 430/314, 322, 325, 330; 355/27; 396/611; 414/935

(56) References Cited

U.S. PATENT DOCUMENTS

| | | | | |
|---|---|---|---|---|
| 3,904,492 A | * | 9/1975 | Rich et al. | 205/126 |
| 4,988,609 A | * | 1/1991 | Hashimoto et al. | 430/326 |
| 5,219,791 A | * | 6/1993 | Freiberger | 437/195 |
| 5,667,942 A | * | 9/1997 | Nakao et al. | 430/327 |
| 5,692,070 A | * | 11/1997 | Kobayashi | 382/145 |
| 5,932,380 A | * | 8/1999 | Yaegashi et al. | 430/30 |
| 6,022,672 A | * | 2/2000 | Ikeda | 430/325 |
| 6,057,084 A | * | 5/2000 | Mohondro | 430/330 |
| 6,100,015 A | * | 8/2000 | Yamana | 430/322 |

\* cited by examiner

Primary Examiner—Mark F. Huff
Assistant Examiner—Nicole Barreca
(74) Attorney, Agent, or Firm—Robert L. King

(57) ABSTRACT

The invention relates to a system and a method for manufacturing semiconductor devices on a wafer with the steps of: coating (201) a photoresist onto said wafer, heating (202) said wafer to a prebake temperature for outgassing the solvent of the photoresist, exposing (203) said wafer to deep UV light for chemically modifying said photoresist in predetermined areas, heating (204) said wafer to a post exposure bake temperature for activating a chemical reaction, developing (205) said photoresist, stabilizing (206) said photoresist, meteorology inspection (207), etching, wet processing or implanting ion, wherein said stabilizing (206) of said photoresist occurs before the beginning of the etch process and comprises a controlled chemical contamination of said photoresist surface by ammonia/amine chemicals.

7 Claims, 3 Drawing Sheets

METHOD AND SYSTEM FOR MANUFACTURING SEMICONDUCTOR DEVICES ON A WAFER

FIELD OF THE INVENTION

The present invention generally relates to a method and a system for manufacturing semiconductor devices on a wafer. In particular, though not exclusively it relates to the technique of forming structures on a wafer surface with deep ultraviolet (deep UV) photoresists.

BACKGROUND OF THE INVENTION

It is well known in the art that patterned photoresist masks being removed during normal non-oxide film etching cause poor mask replication onto the wafer. Patterned deep UV (DUV) photoresist is subject to loss of critical dimensions (CD loss) and thickness reduction during etch operations due to resist erosion (thickness loss) and faceting (profile change). Even resists that have been hardbaked (hotplate or UV cure) can have this problem, and this can be critical in metal and polysilicon layer etches.

The reason is that DUV resists have lower etch resistance than conventional resists. During exposure and post expose bake of DUV resists, acid molecules are generated, which then cleave functional groups off the polymer chain, allowing the resist to be developed. Upon the post exposure bake (PEB) process a DUV resist can lose from 8 to 30% of thickness by volume due to decomposition of the photoresist. This same reaction occurs in a plasma etch chamber, in addition to loss of volume by reaction with etchant gases such as chlorine, and subsequent removal of mass.

Another well known feature of UV resists is that DUV photoresist formulations are sensitive to ammonia or amine chemical poisoning (e.g. from ambient environment) that causes the resist to become less sensitive to lithography exposure and insoluble to developer solutions. This effect is called T-topping, in which the resist reacts with the ammonia/amine chemical (not surface limited—the depth of the reaction is somewhat dependent on the time exposure and concentration) prior to exposure or developing steps. This poisoning also causes loss of profile and critical dimensions in the resultant printed features with as little as 3 ppb concentrations.

In prior art processes UV hardening is combined with chemical poisoning in a standalone tool. In particular photoresist sensitivity to ammonia/amine chemical poisoning and using chemical exposure to make the resist more stable/resistant is known in the art (PRIST). Using the ammonia/amine chemical poisoning to improve etch/implant or liquid processing has been disclosed and presented in the prior art.

Moreover, there are additional gases or vapors that are known to create similar benefits in resists by adding mass (not poisoning) by chemical bonding to the surface. These different chemicals can shrink resist features (trimming) or cause them to swell compensating for mask or etch biases.

However, both the additional pre-treatment of the UV resist by UV cure before baking as well as the treatment of the wafer with a dedicated reactive gas as preparation of the UV resist corresponds to a separate step and tool in processing the wafer, which is time consuming and expensive.

The present invention seeks to streamline and condense processing of wafers, to shorten the overall processing time and to reduce the tools to a minimum necessary number.

A specific embodiment of the invention will now be further described, by way of example only, with reference to the accompanying drawings.

DETAILED DESCRIPTION OF A PREFERRED EMBODIMENT

Figure 1:
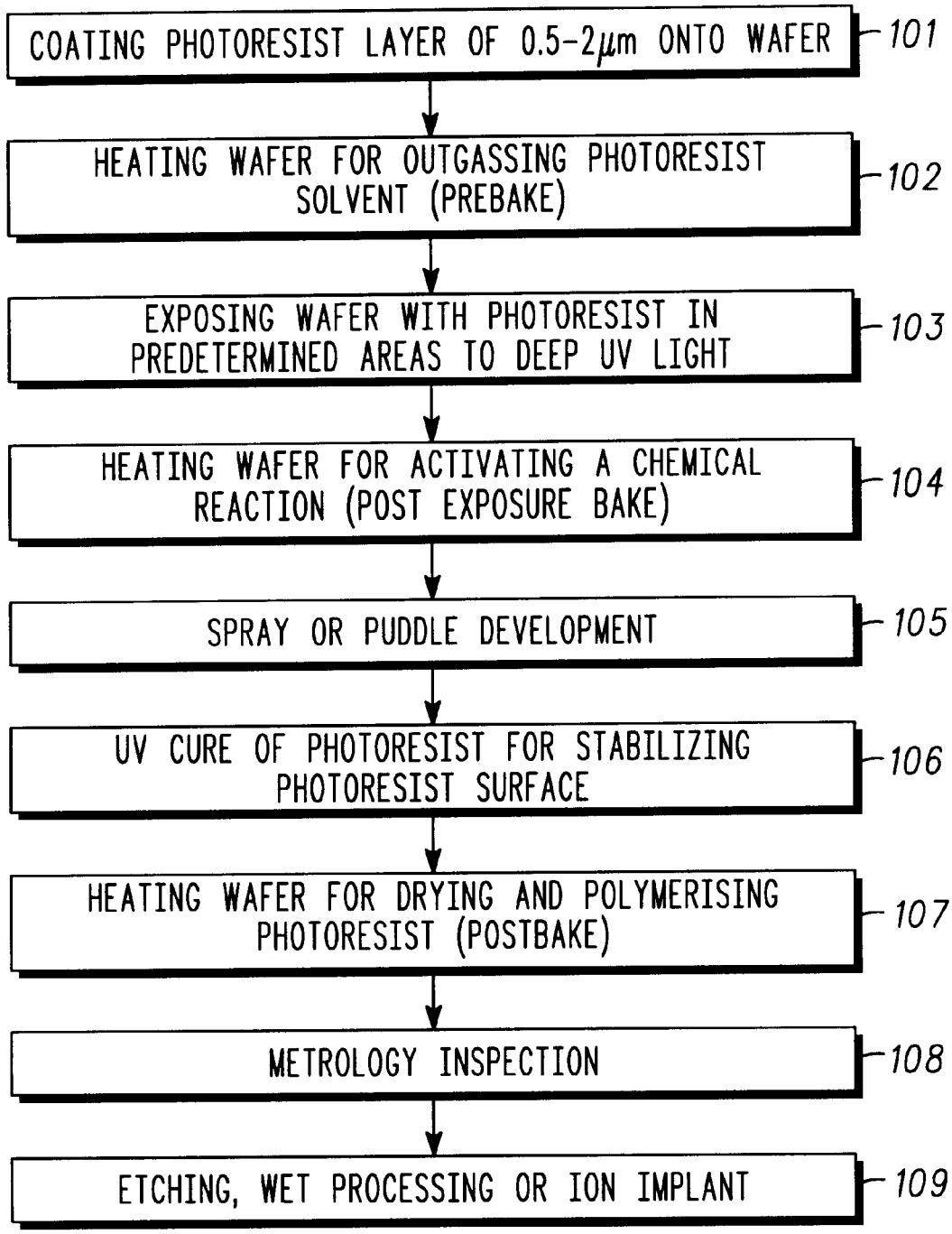
FIG. 1 illustrates the steps in a known manufacturing process of semiconductor devices on a wafer.

According to the present invention, the etch resistance is increased and resist decomposition during etch is prevented. The decomposition of the UV resist is blocked by specific chemical poisoning (amine or ammonia) to prevent the acid generation. The effect of ammonia / amine chemical contamination of the photoresist as a lithography problem is used to benefit etch performance and manufacturability. In order to streamline the whole process this effect is applied in an etch chamber in situ prior to the beginning of the etch process, and after completion of the lithography process. Within the etch chambers in situ and prior to the etch processing this is done as an initial etch recipe step, using these chemicals (gas/vapor) to create the poisoned surface (with or without plasma) to stabilize the resist, improve etch selectivity (more etch resistant) and minimize resist profile changes.

According to a first aspect of the present invention there is provided a method for wet processing or implanting ions, wherein said stabilizing of said photoresist occurs before the beginning of the etch process and comprises controlled chemical contamination of said surface by ammonia/amine chemicals.

Optionally said wafer may be cooled after the post exposure bake, and there may be provided a step of heating of said wafer to a postbake temperature and UV curing said photoresist for stabilizing the photoresist. Preferably the method comprises additionally the steps of heating the wafer to about 200° C. for removing $H_2O$ being adsorbed at the wafer surface (dehydration bake) and applying an adhesion enhancing agent (e.g. HMDS) on to the wafer surface for facilitating adhesion of a photoresist on said wafer surface before the photoresist is applied to the wafer surface. Coating of said photoresist is preferably performed by spin-on coating at various rotation speeds.

According to a second aspect of the present invention there is provided a system for manufacturing semiconductor devices on a wafer comprising: means for coating a photoresist onto said wafer, means for heating said wafer to a prebake temperature for outgassing the solvent of the photoresist, means for exposing said wafer to deep UV light for chemically modifying said photoresist in predetermined areas, means for heating said wafer to a post exposure bake temperature for activating a chemical reaction, means for developing said photoresist, means for stabilizing said photoresist, means for performing a metrology inspection, means for etching, wet processing or implanting ions, wherein said means for stabilizing said photoresist before the beginning of the etch process comprises means for controlled chemical contamination of said surface by ammonia/amine chemicals.

Optionally said means for heating of said wafer to a post exposure bake temperature may comprise means for cooling said wafer after the post exposure bake, and there may be provided means for heating said wafer to a postbake temperature and for UV curing.

Preferably the system comprises additionally means for heating the wafer to about 200° C. for removing $H_2O$ being adsorbed at the wafer surface (dehydration bake) and means for applying an adhesion enhancing agent (e.g. HMDS) on to the wafer surface for facilitating adhesion of a photoresist on said wafer surface before the photoresist is applied to the wafer surface. Preferably said means for coating said photoresist are apt for spin-on coating at various rotation speeds.

As a number of advantages the invention eliminates a lithography process step and a process tool, allows adjustment of the patterned CD to compensate for mask bias and etch biases, increases resist stability and selectivity to films in aggressive etch processes, and it allows a separation from the supplier and the process of the step eliminated and allows specific customisation of the process. This may become especially important for manufacturers of advanced less or equal to 0.13 $\mu$ memory and microprocessor ICs seeking to produce desired lithography and CDs prior to etch, and to eliminate unnecessary process tools and steps from their processes and users of advanced lithography and resist systems such as 193 nm and 157 nm to improve etch characteristics.

Referring to FIG. 1, the known method for manufacturing semiconductor devices on a wafer includes the following steps. In a first step 101 a photoresist is coated onto a wafer on which semiconductor devices are to be formed. In the following it is assumed that the photoresist is specified for UV light, in particular it is specified for deep UV light. Deep UV light has a wavelength of about 248 nm. Generally the photoresist is applied by spin-on coating at various rotation speeds, such as 5000 rpm for 200 mm wafers, so as to yield a photoresist layer of 0,5–2 $\mu$m. In a second step 102 said wafer is heated for outgassing the solvent of the photoresist. The maximum temperature in this "prebake" step is about 200° C.

Whereas coating of the wafer with the photoresist and prebake is carried out in a first tool, the coated wafer must be brought to a separate chamber, i.e. the second tool, usually connected to the first tool as a photocell, where it is adjusted and exposed to deep UV light for chemically modifying said photoresist in predetermined areas (step 103). After the exposure the wafer is heated again (step 104) to a post exposure bake temperature of about 100° C. The purpose of this post exposure bake 104 is to activate the chemical reaction that was initiated by the deep UV exposure.

After post exposure bake (step 104) or directly after exposure (step 103) of the wafer the photoresist is developed (step 105) in the first tool again. A developer is applied to the surface of the exposed photoresist by spraying (spray development) it or by pouring it (puddle development). The developer is then rinsed off with water and the wafer is post-baked on a hotplate in step 107 for drying and polymerising the photoresist.

During postbake the temperature reaches 100° C. to 180° C., depending on the subsequent process steps. However, the photoresist is very sensitive immediately after the development in step 105 and it may begin to flow during postbake due to high temperatures. Thus the precision of the structure may be impaired. In order to avoid such adverse effects an UV cure of said photoresist surface is performed in step 106 according to prior art, together with the postbake. In step 106 the photoresist is treated with UV light of about 250 nm wavelength so that the photoresist is hardened and made less sensitive to mechanical and thermal effects.

After the above heating of the wafer to 100° C.–180° C. for drying and polymerising said photoresist (postbake) in step 107 a metrology inspection follows in step 108, and finally etching, wet processing or ion implant follows in step 109.

A severe drawback in the above prior art processing of wafers is that e.g. the UV cure step has to be a distinct step that is carried out in a separate, third tool. Moreover, step 106 of curing the surface of the UV resist takes about 2 to 5 minutes per wafer, which is a fairly long time in comparison to other process steps.

According to the invention the method for manufacturing semiconductor devices on a wafer is therefore modified in that the UV cure is replaced by a different kind of resist treatment which, moreover, enables a reduction of the process sequence.

Figure 2:
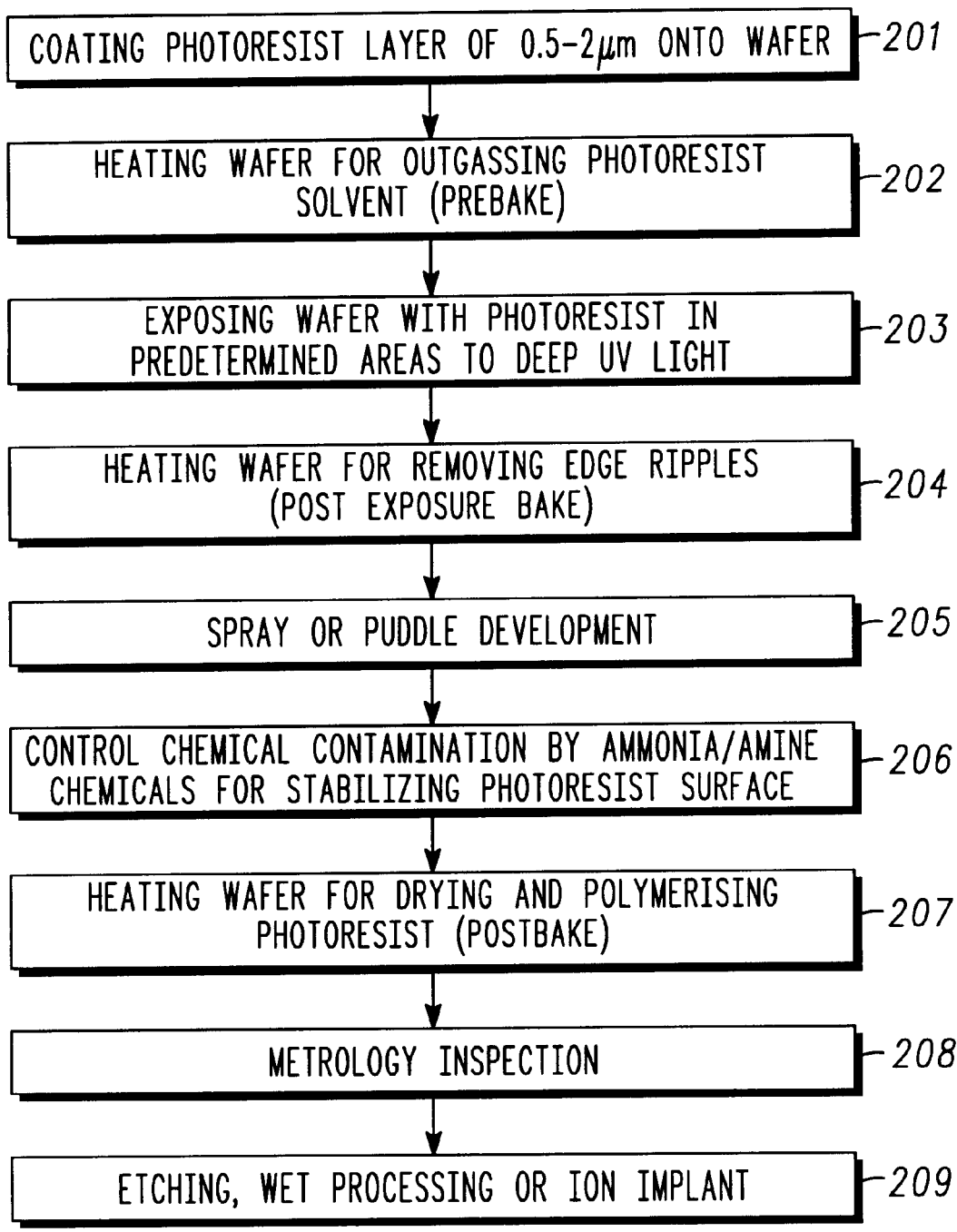
FIG. 2 illustrates an embodiment of the steps in a manufacturing process of semiconductor devices on a wafer according to the invention.

This modified process is illustrated in FIG. 2, with the reference numerals being equal to the numerals used in FIG. 1 except for the replacement of the first digit "1" in FIG. 1 by the digit "2" in FIG. 2. The basic steps in FIG. 2 remain the same as in FIG. 1, namely after coating the photoresist onto the wafer in step 201 so as to yield a layer of 0,5–2 $\mu$m, preferably by spin-on coating at various rotation speeds such as 5000 rpm for 200 mm wafers, the wafer is heated to 100° C. for outgassing the solvent of the photoresist (prebake) in step 202. After adjusting and exposing the wafer to deep UV light for chemically modifying said photoresist in predetermined areas in step 203 the wafer is heated to 100° C. in step 204 for activating a chemical reaction of the photoresist (post exposure bake). The wafer undergoes a spray or puddle development of the photoresist in step 205 then, and it is heated to a temperature between 100° C. and 180° C. in step 207, depending on the subsequent processing steps, for drying and polymerising the photoresist (postbake). Finally a metrology inspection follows in step 208 and etching, wet processing or ion implant follows in step 209.

The difference to the above prior art process lies in the treatment of said photoresist surface for stabilizing said photoresist (resist treatment) in step 206. Instead of an UV cure in a separate chamber together with the postbake in step 207 the wafer undergoes a controlled chemical contamination of the photoresist surface by ammonia/amine chemicals. As has been explained above it is known that such treatment results in a hardened surface of the photoresist with the desired properties which are also achieved by the UV cure. However, the advantage of the controlled chemical contamination of the photoresist surface is that the treatment can very well be integrated into the line of process. Namely, the controlled chemical contamination according to the invention can be set up as in situ treatment within the tool for etching (step 209) thus rendering an extra tool dispensable and reducing the processing sequence. For such in situ treatment of the wafer a controllable valve for ammonia/amine gases/vapours is provided in the etch chamber according to the invention. Through this controllable inlet ammonia l amine chemicals are let into the etch chamber to react with the photoresist surface and to improve the resistance of the photoresist to etch plasmas typically containing chlorine or bromine species. Due to the chemical treatment the photoresist pattern will have greater resistance to the etch chemistries (selectivity) and allow for more aggressive etches to be used to improve wafer throughput, and other etch outputs. Basically this technique uses the known concept of the chemical reaction of ammonia or amine gases/ vapors to harden the DUV photoresist film after lithographic exposure processing has completed. Deep UV photoresist formulations are sensitive to ammonia-type (such as amines, etc.) chemical poisoning that causes the resist to become less sensitive to exposure, and insoluble to developer solutions. This effect is called T-topping in which the surface reacts with the ammonia/amine chemical (the thickness is dependent on the time exposure and concentration) prior to exposing or developing and causes loss of profile and critical dimensions. In order to suppress these effects prevention of chemical exposure of the wafer to ammonia and amine chemicals must be done during photoresist coating (step 201), baking (steps 202, 204) and especially patterning (exposure) (step 203), and developing (step 205). This requires special chemical filtration units within the coat module and the exposure tool to maintain the ammonia/amine concentration at extremely low levels (<3 ppb).

Yet, whereas the uncontrolled contamination of the photoresist by ammonia/amine chemicals is undesired in the above steps 201–205, it is utilized for the intended preparation of the photoresist together with the postbake according to the invention in step 206. Once the steps 201–205 have been completed the wafer with the photoresist is intentionally exposed to amino/amine chemicals in the etch chamber and the resist is "poisoned" in step 206. One aspect of a poisoned resist is the hardened surface is more resistant to plasma etch, implantation or solvent/acid exposure. This allows better control of linewidth dimensions (CDs), profile stability, and reduces the removal of photoresist (improves selectivity to etched film) during aggressive plasma etch processes or high energy dose implant steps.

In order to shorten the entire processing sequence the resist can be exposed to the ammonia/amine-based chemicals as part of the etch process. The etch tool would be modified to support an ammonia/amine-based gas flow. The process could be done with or without a plasma (generation of UV light). This dedicated step would be done prior to the standard etch process as an initial step. The wafer would be exposed to various pressures (>100 millitorr) for a given period of time (15–90 seconds), plasma UV light, and temperature. To enhance the effect, a variable energy plasma could be used (with power levels sufficient to strike a uniform, stable plasma). This would shorten the process time without significantly affecting the resist features (profile, linewidth) or the etchable film. Following this step, the chamber would be pumped down, and the standard etch steps would be run. After etch processing, the resist can be removed by conventional ash and clean processes. There may be less non-ashable artifact (veils) after plasma ash depending on the etch chemistry.

By incorporating step 206 into the etch chamber, the UV cure step in prior art lithography is eliminated, and additional improvement in resist performance during etching is attained. Accordingly, the method according to the invention may save 1 to 2 hours per photoresist layer in comparison with the prior art and over a typical 24 resist layers in the entire manufacturing process 1 to 2 days are saved of the entire processing time of the semiconductor device.

A further advantage of the invention is its easy extension to future developments in the field of photoresists. In the case that there was a plasma-developable anti-reflective coating (such as a BARC layer), this step would be run following the hardening step (this usually uses oxygen chemistry with-short, medium energy plasmas). The hardening step done prior to the plasma ARC developing step would prevent loss of resist thickness or profile due to this chemistry.

This procedure would provide better photoresist selectivity (important especially due to less deep UV photoresist film thickness being used <10,000 Å), profile control and CD variation for aggressive plasma etch processes such as metal, trench, or oxide etch processes.

In the following tables 1 and 2 examples of the process benefit are given: the data shows that with the standard poisoning processes the CD etch loss is reduced with some minor improvement in etch resistance.

TABLE 1

| measured CDs prior to etch | CD shrinkage | swelling |
| --- | --- | --- |
|  | −28% | +10% |

TABLE 2

| resist thickness (metal etch) remaining | 8 – 18% more resist post-etch |
| --- | --- |

The different tool processes can be matched by using FTIR analysis, and characterisation of the hydroxyl, carbonyl spectra, along with resist measurement data in comparison to UV cure process outputs.

The invention can be applied to 193 and 157 nm resists too. Having the ability to adjust the CDs while increasing etch resistance (metal etch) and profile stability (polysilicon) may be crucial until these resist chemistries mature (they have a similar improvement curve as DUV).

Summarizing, in a process overview the standard prior art flow comprises the basic steps photoresist coat—exposure—post exposure bake: develop: UV cure (resist treatment and post bake): metrology inspection: etch, whereas the modified flow according to the invention comprises the basic steps photoresist coat—exposure—post exposure bake: develop: metrology inspection: in situ treatment/etch. Thus compared with prior art processes the order of processing steps has slightly changed with the method according to the invention, namely stabilizing is the immediate step before etching with the invention, whereas it was separated from etching by metrology inspection with the prior art.

Figure 3:
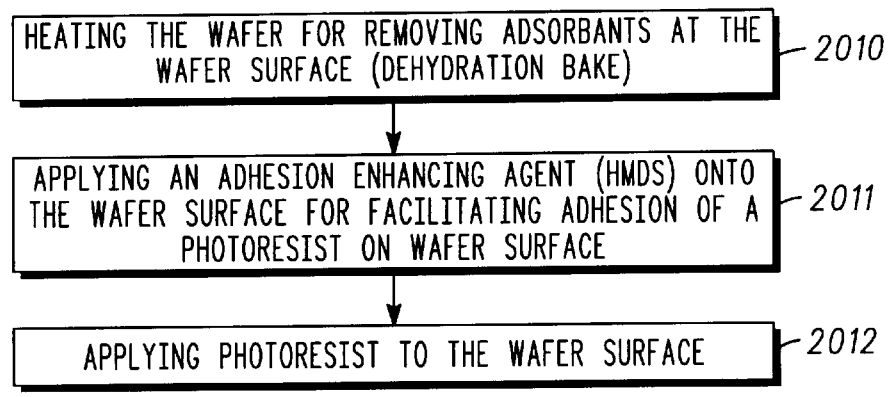
FIG. 3 illustrates preferred preparation steps of the process according to the invention, and FIGS. 4AB illustrate an example of a semiconductor layer sequence as obtained in a process according to the invention.

Referring to FIG. 3, as a refinement of the process the wafer is heated to about 200° C. in step 2010 at the very beginning of the process for removing H$_2$O on the wafer surface. The first heating 2010 is accordingly named dehydration bake. Subsequently an adhesion enhancing agent (HMDS) is applied onto the wafer surface in step 2011 for facilitating adhesion of a photoresist on said wafer surface, and the photoresist is applied in step 2012, thus completing the coating of the wafer in step 201, FIG. 2.

Figure 4A:
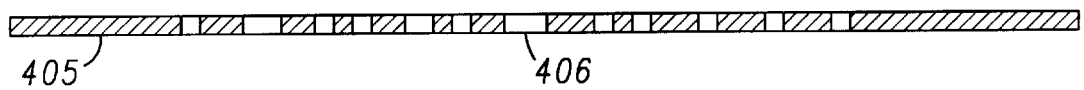
Figure 4B:
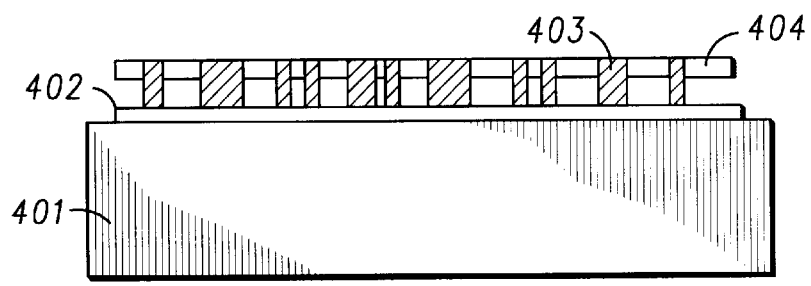

In FIGS. 4AB an overview of the sequence of layers in a semiconductor device during the process of manufacturing after step 206/207 is illustrated. On a wafer 401 an adhesion enhancement agent 402 is applied, on which in turn a photoresist layer 403 is coated (FIG. 4B). Above the wafer 401 with photoresist 403 on it a reticle 405 with structure elements 406 (FIG. 4A) is shown through which the wafer has been exposed to light from a deep UV light source (not shown). In the photoresist layer 403 the corresponding features are shown as hatched areas. The upper surface of the photoresist 403 has turned into a hardened surface film 404, due to the photoresist treatment in step 206, FIG. 2. The photoresist 403 is thus prepared for the postbake in step 207.

As a second aspect of the invention a photoresist system for manufacturing semiconductor devices on a wafer is provided. The system according to the invention comprises as a first element means for coating a photoresist onto said wafer. Preferably the means for coating said photoresist are apt for spin-on coating at various rotation speeds. Further, means for heating said wafer to a prebake temperature of about 100° C. for outgassing the solvent of the photoresist may be provided. After the prebake the wafer with the photoresist on its surface enters means for exposing said wafer to deep UV light, where the photoresist is chemically modified in predetermined areas, and means for developing said photoresist.

Before the wafer with photoresist is baked again at a temperature of 100° C. to 180° C. for drying and polymerising after development of the photoresist, means for stabilizing said photoresist are provided on the process track. According to the invention the stabilization of said photoresist before the beginning of the etch process comprises means for a controlled chemical contamination of said surface by ammonia/amine chemicals. However, to perform this resist treatment in the UV cure system of the prior art would necessitate significant modifications of the UV tool. The tool applicator must become a vacuum chamber capable of flowing ammonia/amine gases, with purging (or addition of a loadlock) to prevent atmospheric contamination, and pumping with exhaust scrubbing. These modifications are not trivial, increasing tool cost and complexity with the potential to contaminate a factory with low levels of the ammonia chemical. According to the invention the photoresist stabilization together with the postbake is therefore incorporated in the etch chamber. The etch chamber fulfills the above requirements with minimal modification (e.g. plumbing ammonia/amine compounds to the etch tool), and it is thus suited for step 206. Thus, the means for photoresist stabilization and means for heating said wafer to a postbake temperature for drying and polymerising the photoresist, means for metrology inspection, and means for etching, wet processing or implanting ions are integrated into one chamber. With this configuration the desired plasma assisted curing of photoresist as part of an etch process becomes feasible.

In a preferred embodiment the system comprises additionally means for heating the wafer to a dehydration bake temperature and means for applying an adhesion enhancing agent on to the wafer surface for facilitating adhesion of said photoresist on said wafer surface before the photoresist is applied to the wafer surface.

It will be clear from the above description of a preferred embodiment that the method according to the invention is a valuable and efficient method to increase etch performance by enhancing the resist properties, and improve manufacturing metrics such as cycle time. It differs from prior art in that the method can readily be incorporated into existing tool, UV exposure as a preparatory step is made dispensable, fine tuning of time and pressure for full incorporation in film is made feasible, contamination from outgassing is suppressed as wafers move through fab.

Further, the invention is susceptible of application by all DUV resist users and equipment suppliers, and the benefits of the invention become greater as geometries of the semiconductor device shrink and resist thicknesses decrease.

While the invention has been described in terms of particular structures, devices and methods, those of skill in the art will understand based on the description herein that it is not limited merely to such examples and that the full scope of the invention is properly determined by the claims that follow.

REFERENCE NUMERALS 101 coating photoresist
102 heating wafer to first temperature
103 exposing wafer
104 heating wafer to second temperature
105 spray or puddle development
106 UV cure
107 heating wafer to third temperature
108 metrology inspection
109 etching, wet processing, ion implant
201 coating photoresist
202 heating wafer to first temperature
203 exposing wafer
204 heating wafer to second temperature
205 spray or puddle development
206 controlled chemical contamination
207 heating wafer to third temperature
208 metrology inspection
209 etching, wet processing, ion implant
2010 heating wafer to fourth temperature
2011 applying adhesion enhancement agent
2012 applying photoresist onto adhesion enhancement agent
401 substrate
402 adhesion enhancement agent
403 photoresist
404 stabilized surface film of photoresist
405 reticle for deep UV exposure
406 structure elements on reticle

What is claimed is:

1. A method for manufacturing semiconductor devices on a wafer comprising the steps of:
   coating a photoresist onto said wafer,
   heating said wafer to a prebake temperature for outgassing a solvent of the photoresist,
   exposing said wafer to deep UV light for chemically modifying said photoresist in patterned areas,
   heating said wafer to a post exposure bake temperature for activating a chemical reaction,
   developing said photoresist,
   metrology inspection,
   and further processing the wafer after metrology inspection by placing the wafer in a chamber that is a separate tool from equipment used for all prior manufacturing steps, stabilizing the photoresist by introducing ammonia/amine chemicals into the chamber and exposing the photoresist to the amino/amine chemicals, pumping the chamber to remove the amino/amine chemicals and using the same chamber to perform in situ stabilizing and either etching of the wafer or implanting ions into the wafer, wherein said amino/amine chemicals are isolated from contamination of equipment performing photoresist coating and developing.

2. The method according to claim 1, comprising additionally the steps of: while the wafer is in the chamber, exposing the wafer to a plasma to shorten processing time.

3. A photoresist system for manufacturing semiconductor devices on a wafer comprising:
   means for coating a photoresist onto said wafer,
   means for heating said wafer to a prebake temperature for outgassing a solvent of the photoresist,
   means for exposing said wafer to deep UV light for chemically modifying said photoresist in patterned areas,
   means for heating said wafer to a post exposure bake temperature for activating a chemical reaction, means for developing said photoresist, and a single etch chamber tool for a controlled chemical contamination of a surface of the wafer followed by etching the wafer, wherein said controlled chemical contamination of the wafer occurs in situ with and before the beginning of the etching and comprises means for a controlled chemical contamination of said surface by ammonia/amine chemicals, the single etch chamber tool isolating the ammonia/amine chemicals from contaminating environments of the means for coating, the means for exposing and the means for developing.

4. The system according to claim 3, comprising additionally means for pumping the single etch chamber tool after the controlled chemical contamination and prior to the etching.

5. The system according to claim 3, wherein said single etch chamber tool is a vacuum chamber wherein a single vacuum is used for the controlled chemical contamination and the etching.

6. A method for manufacturing semiconductor devices on a wafer comprising:

processing the wafer by coating a photoresist on the wafer, patterning the photoresist by an exposure to deep ultraviolet light, and developing the photoresist; and subsequently placing the wafer in an etch chamber that is chemically isolated from all prior manufacturing steps to avoid contamination of the prior manufacturing steps, stabilizing the photoresist by introducing amino/amine chemicals into the etch chamber and exposing the photoresist to the amino/amine chemicals, pumping the etch chamber to remove the amino/amine chemicals and using the etch chamber to perform in situ etching of the wafer with a same vacuum and prior to removal of the wafer from the etch chamber, wherein said amino/amine chemicals are isolated from contamination of equipment performing photoresist coating and developing.

7. The method of claim 6, further comprising:

forming a variable energy plasma in the etch chamber during stabilizing of the photoresist, the variable energy plasma reducing processing time.

* * * * *